(12) United States Patent
Zhang et al.

(10) Patent No.: US 9,735,120 B2
(45) Date of Patent: Aug. 15, 2017

(54) LOW Z-HEIGHT PACKAGE ASSEMBLY

(71) Applicant: INTEL CORPORATION, Santa Clara, CA (US)

(72) Inventors: Qinglei Zhang, Chandler, AZ (US); Sri Ranga Sai Boyapati, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 211 days.

(21) Appl. No.: 14/138,754

(22) Filed: Dec. 23, 2013

(65) Prior Publication Data

US 2015/0179593 A1    Jun. 25, 2015

(51) Int. Cl.
*H01L 23/52* (2006.01)
*H01L 23/00* (2006.01)

(52) U.S. Cl.
CPC .............. *H01L 24/06* (2013.01); *H01L 24/19* (2013.01); *H01L 24/20* (2013.01); *H01L 2224/04105* (2013.01); *H01L 2224/12105* (2013.01); *H01L 2224/16225* (2013.01); *H01L 2924/10253* (2013.01); *H01L 2924/181* (2013.01)

(58) Field of Classification Search
CPC ......... H01L 24/06; H01L 24/03; H01L 24/16; H01L 24/19; H01L 24/20; H01L 2224/033; H01L 2224/035; H01L 2224/03831; H01L 2224/0401; H01L 2224/04105; H01L 2224/05022; H01L 2224/05147; H01L 2224/1133
USPC ........................................................ 257/738
See application file for complete search history.

(56) References Cited

U.S. PATENT DOCUMENTS

| | | | |
|---|---|---|---|
| 5,989,993 A | 11/1999 | Zakel et al. | |
| 6,091,754 A * | 7/2000 | Jiang | H01S 5/0264 372/46.01 |
| 6,372,622 B1 * | 4/2002 | Tan | H01L 24/03 228/180.22 |
| 7,450,625 B2 * | 11/2008 | Kaneko | B82Y 20/00 372/38.05 |
| 7,652,244 B2 * | 1/2010 | Aizpuru | G01D 5/342 250/214.1 |
| 7,838,991 B1 * | 11/2010 | Mostafazadeh | H01L 24/03 257/737 |
| 8,023,539 B2 * | 9/2011 | Ueno | H04B 10/504 372/26 |
| 2003/0107129 A1 * | 6/2003 | Ono | H01L 21/4857 257/734 |

(Continued)

OTHER PUBLICATIONS

Office Action dated Mar. 3, 2017 for Chinese Patent Application No. 201410857916.9, 29 pages.

*Primary Examiner* — Tod T Van Roy
*Assistant Examiner* — Vu A Vu
(74) *Attorney, Agent, or Firm* — Schwabe, Williamson & Wyatt, P.C.

(57) ABSTRACT

In embodiments, a package assembly may include a die coupled with one or more conductive pads. A barrier layer may be directly coupled with and between the die and one or more of the conductive pads. The package assembly may further include a solder resist layer coupled with the die and the conductive pads, and one or more interconnects positioned at least partially within the solder resist layer and directly coupled with one or more of the conductive pads.

19 Claims, 7 Drawing Sheets

(56) References Cited

U.S. PATENT DOCUMENTS

2006/0091536 A1 5/2006 Huang et al.
2012/0061835 A1* 3/2012 Hosseini ............ H01L 24/03
　　　　　　　　　　　　　　　　　　　　 257/739

* cited by examiner

LOW Z-HEIGHT PACKAGE ASSEMBLY

FIELD

Embodiments of the present disclosure generally relate to the field of package assemblies with low layer count and/or low z-height.

BACKGROUND

The continuous miniaturization of package assemblies has been a challenge for substrate manufacturers. Specifically, miniaturization has generated a drive to create package assemblies with reduced layer count and reduced z-height.

In some embodiments, it may be desirable for a solder resist layer to be applied directly to, or deposited on, one or more conductive traces or pads in the package assembly. In order for the solder resist layer to appropriately bond to the conductive traces or pads, it may be desirable for the traces or pads to be chemically etched or roughened. However, the etching or roughening of the pads may additionally chemically etch or roughen the underlying die, which may produce component failure or other undesirable effects.

BRIEF DESCRIPTION OF THE DRAWINGS

FIGS. 1-A through 1-F illustrate an example of a package assembly at various stages of the manufacturing process, in accordance with embodiments.

FIGS. 2-A through 2-C illustrate another example of a package assembly at various stages of the manufacturing process, in accordance with embodiments.

FIGS. 3-A through 3-F illustrate another example of a package assembly at various stages of the manufacturing process, in accordance with embodiments.

DETAILED DESCRIPTION

Embodiments of the present disclosure generally relate to the field of package assemblies with low layer count and/or low z-height. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first feature formed, deposited, or otherwise disposed on a second feature," may mean that the first feature is formed, deposited, or disposed over the feature layer, and at least a part of the first feature may be in direct contact (e.g., direct physical and/or electrical contact) or indirect contact (e.g., having one or more other features between the first feature and the second feature) with at least a part of the second feature.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Figure 1:
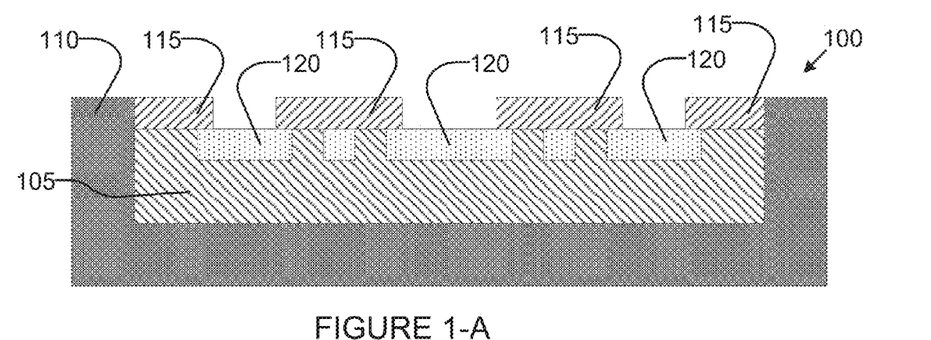

As noted above, package size scaling may be a critical challenge for substrate and package assembly manufacturing. In some embodiments an embedded panel level ball grid array (E-PLB) architecture may enable a smaller form factor (FF) package with a reduced layer count or z-height. Alternatively, a bumpless build-up layer (BBUL) direct plating architecture may allowed a reduced layer count of z-height for the package. FIGS. 1-A through 1-F depict an example of such a package assembly at various stages of the manufacturing process. In embodiments, one or more elements may be introduced in an earlier figure, for example FIG. 1-A, and then assumed to carry over to later Figures such as 1-B. Therefore, each and every element of the package assembly 100 may not be labeled in each and every stage of FIGS. 1-A through 1-F for the sake of clarity and the ease of understanding. Similar numbers may have been left out of FIGS. 2-A through 2-C and 3-A through 3-F, below, for similar reasons.

Specifically, FIG. 1-A depicts a package assembly 100 including a die 105 and a plurality of conductive wires or traces 120 within the die 105. The die 105 may be, for example silicon or some other electrically or thermally non-conductive material. The traces 120 may be copper or some other electrically conductive material such as gold (Au). Although not shown, in some embodiments, the die 105 may include one or more transistor devices and/or various layers of interconnect structures formed on active side of the die 105 to route electrical signals and/or power to the one or more transistors devices. Specifically, in some embodiments the die 105 may include one or more layers or materials such as a dielectric material, a substrate, a semiconductor material, a passivation layer, or some other material or layer that may be known in the art. For example, the traces 120 may generally represent one or more of the interconnect structures configured to route the electrical signals of the die 105.

In some embodiments, the die 105 may be at least partially surrounded by a mold compound 110 or some other electrically and/or thermally neutral layer that may increase the lateral surface area of, and/or electrically or thermally insulate, the package assembly 100. In some embodiments, the mold compound 110 may be epoxy, though in other embodiments the mold compound may be or may include phenolic, unsaturated polyester, thermosetting polyimide, etc. In some embodiments, the package assembly 100 may include a surface coat 115 that may include, for example silicon nitride ($SiN_x$) or some other electrically or thermally non-conductive material, where x represents a suitable relative quantity of the element. In embodiments, the surface coat 115 may be placed on the surface of the die 105 and/or the traces 120 to serve as the passivation layer discussed above, which may protect the traces 120 from oxidation. In some embodiments, the surface coat 115 may have a z-height that is generally level with the z-height of the mold compound 110, as shown in FIG. 1-A.

Next, as shown in FIG. 1-B, a barrier layer 125 may be deposited over the surface of the package assembly 100. Specifically, the barrier layer 125 may be deposited over the surface of the package assembly 100, mold compound 110, on the surface coat 115, and the traces 120, as can be seen. In embodiments, the barrier layer 125 may be or include one or more of titanium (Ti), titanium nitride (TiN), tantalum (Ta), tantalum nitride (TaN), titanium tungstate (TiW), or some other appropriate barrier type material. In some embodiments the barrier layer 125 may be sputter deposited on the package assembly 100, while in other embodiments the barrier layer 125 may be deposited or otherwise formed on the package assembly using some other technique or process. In embodiments, the barrier layer 125 may have a thickness or z-height of approximately 100 nanometers (nm). As described further below, the barrier layer 125 may protect one or both of the traces 120 and the die 105 from a roughening or etching process. Therefore, the thickness of the barrier layer 125 may vary according to, for example, the materials or processes used in the roughening or etching process. After the barrier layer 125 is deposited on the package assembly, a seed layer 130 may be deposited on the barrier layer. The seed layer 130 may be a conductive material such as copper or aluminum. In embodiments, the seed layer 130 may have a thickness or z-height of approximately 500 nm, though in other embodiments the seed layer 130 may be thicker or thinner. As noted above, the die 105 may include one or more different layers such as a passivation layer. The barrier layer 125 may be coupled directly with the passivation layer portion of the die 105 in some embodiments. In other embodiments, the barrier layer 125 may be coupled directly with the dielectric material of the die 105, the semiconductor material of the die 105, or some other element of the die 105.

As shown in FIG. 1-C, after the deposition of the seed layer 130, one or more pads or traces 135a and 135b may be deposited on the package assembly 100. For the purposes of discussion herein, the term "pad" will be used as a generic term to refer to either a pad or a trace. In embodiments, the pads 135a and 135b may be formed of the same material as the seed layer 130. For example, if the seed layer 130 is copper, then the pads 135a and 135b may also be formed of copper. Although not shown here, in other embodiments the pads 135a and 135b may be formed of one or more of the same or different materials than the seed layer 130.

Specifically, to form the pads 135a and 135b a dry fill resist (DFR) may be deposited and patterned on the package assembly 100. The pads 135a and 135b may then be formed using a process such as electrolytic copper plating for copper pads 135a and 135b, though in other embodiments a different pad deposition process may be used. In some embodiments, the pads 135a and 135b may be formed in an area generally between two portions of the surface coat 115. As shown in FIG. 1-C, the surface coat 115 may generally define a cavity in which the pads 135a and 135b may be deposited. In some embodiments a pad such as pad 135a may occupy the entire cavity, while in embodiments a pad such as pad 135b may occupy only a portion of the cavity. In some embodiments (not shown), a pad may be formed on a portion of the package assembly 100 directly over the surface coat 115 and not in one of the discussed cavities. In these embodiments, the pads 135a and 135b may be electrically and/or thermally coupled with one or more of the traces 120 by way of one or more vias through the surface coat 115.

After the pads 135a and 135b are formed, the DFR may be removed. In some embodiments, a DFR adhesion promoter material (not shown) may be required to assist with the adhesion between the DFR layer and the seed layer 130. As shown in FIG. 1-C, the pads 135a and 135b may include an outer surface 140 that is opposite the side of the pad 135a and 135b that is directly coupled with the barrier layer 125 and the remainder of the package assembly 100. In some embodiments, after the pads 135a and 135b are formed, the outer surface 140 of the pads 135a and 135b may be relatively smooth, as discussed below in greater detail. As a result, the relatively smooth metallic outer surface 140 of the pads 135a and 135b may not securely adhere to a later-applied solder resist layer, as discussed in embodiments below.

Turning to FIG. 1-D, after the pads 135a and 135b are deposited on the package assembly 100, the outer surface 140 of the pads 135a and 135b may be etched or roughened. Specifically, as described below, the outer surface 140 of the pads 135a and 135b may be chemically etched so that a solder resist layer will more strongly adhere to the outer surface 140 of the pads 135a and 135b. In some embodiments, the etching process may be referred to as flash etching. In some embodiments, the etching may involve spraying a solution onto the surface of the package assembly 100. The solution may be a peroxide-based solution that may at least partially etch or otherwise roughen the outer surface 140 of the pads 135a and 135b, though in other embodiments other solutions may be used. In some embodiments the solution may also etch or otherwise roughen the exposed portions of the barrier layer 125, but the barrier layer 125 may be of a sufficient thickness that would be recognized in the art and/or the solution may be of a sufficient weakness that will be recognized in the art that the solution will not penetrate all the way through the barrier layer 125 to the die 105 or traces 120 below the barrier layer 125. In some embodiments the solution may be applied using one or more other techniques or application methods known in the art.

After the etching, some or all of the barrier layer 125 may be removed from the package assembly 100. In embodiments, the process of removing the barrier layer 125 may be referred to as "stripping" the barrier layer 125. As can be seen in FIG. 1-D, though, in some embodiments at least portions of the barrier layer 125 may remain between the pads 135a and 135b and at least part of the package assembly 100 such as the mold compound 110 or the surface coat 115. In some embodiments, if the pads 135a and 135b are formed on a portion of the barrier layer 125 directly coupled with the die 105 or the traces 120, then the barrier layer 125 may remain between the pads 135a and 135b and the die 105 or the traces 120 after the stripping process. In some embodiments the barrier layer 125 may be stripped using an optical, chemical, masking, or mechanical process, or some other stripping process.

In some embodiments, after the barrier layer 125 is removed or stripped, the package assembly 100 may have one or more cavities 145 wherein the traces 120 are exposed. For example, as shown in FIG. 1-D, the cavity 145 may be between two portions of the surface coat 115. In embodiments, one or more of the traces 120 may be exposed within the cavity 145. As noted above, the outer surface 140 of one or more of the pads 135a and 135b may be etched or otherwise roughened. However, due to the protection of the barrier layer 125 during the etching and/or roughening process, at least part of the traces 120 may not be etched or roughened. Similarly, any portion of the die 105 or mold compound 110 that may have been protected by the barrier layer 125 may not be etched or otherwise roughened.

As shown in FIG. 1-E, a solder resist layer 150 may be deposited on the package assembly 100 on a side of the package assembly generally opposite the mold compound 110, as can be seen. In embodiments, the solder resist layer 150 may be made of epoxy or some other electrically and/or thermally non-conductive material. As can be seen, a relatively large portion of the surface area of the solder resist layer 150 may be coupled directly with one or more of the pads 135a and 135b of the package assembly 100. However, as described above, in many embodiments the pads 135a and 135b may be initially formed of a relatively smooth plated metallic material such as copper. That is, the outer surface 140 of the pads 135a and 135b may be relatively smooth after the pads 135a and 135b are plated on the package assembly 100 as described with respect to FIG. 1-C. For example, the outer surface 140 of the pads 135a and 135b may have a roughness value of approximately 100-200 nm as a result of the pad 135a and 135b deposition process. Therefore, the solder resist layer 150 may not strongly couple with the relatively smooth outer surface 140 of the plated pads 135a and 135b. This weak coupling between the solder resist layer 150 and the outer surface 140 of the plated pads 135a and 135b is why the etching process described above with respect to FIG. 1-D may be desirable. By etching or otherwise roughening the outer surface 140 of the pads 135a and 135b, the outer surface 140 may have a roughness of approximately 500-600 nm, and the solder resist layer 150 may more strongly adhere to the outer surface 140 of the pads 135a and 135b.

As can be seen in FIG. 1-F, after the solder resist layer 150 is deposited, one or more openings 160a and 160b may be formed in the solder resist layer 150 to expose one or more of the pads 135a or 135b. In embodiments, the openings may be formed via chemical, mechanical, or optical etching, or through the use of some other process for removing a selected portion of the solder resist layer 150. For example, in some embodiments a mask may be placed over the solder resist layer 150 and the portion of the solder resist layer exposed by the mask may be etched or otherwise removed, and then the mask may be removed. One or more interconnects such as interconnect 155 may then be coupled with the outer surface 140 of one or more of the pads such as pad 135b as shown in FIG. 1-F. For example, interconnect 155 may be coupled with the pad 135b in opening 160b of FIG. 1-F. The interconnect 155 may be, for example, a solder ball or some other type of interconnect. In some embodiments the interconnect 155 may be a part of or otherwise form a ball grid array (BGA). Although only a single interconnect 155 is shown in FIG. 1-F, in other embodiments the package assembly 100 may include a plurality of interconnects such as interconnect 155, coupled with a plurality of pads such as pads 135a and 135b.

Figure 2:
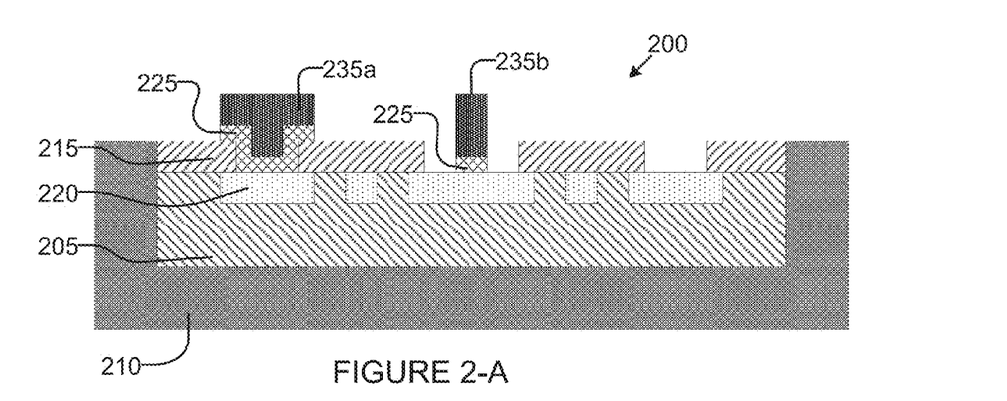

FIGS. 2-A through 2-C depict an alternative example of a package assembly 200 that may have a reduced layer count and or a reduced z-height. In embodiments, elements of the package assembly 200 may be similar to similarly numbered elements of the package assembly 100 of FIG. 1-C. For example, the package assembly 200 may include a die 205, mold compound 210, surface coat 215, traces 220, and pads 235a and 235b which may be respectively similar to the die 105, mold compound 110, surface coat 115, traces 120, and pads 135a and 135b of the package assembly 100 of FIG. 1-C. In the package assembly 200, the barrier layer 225 may be similar to the barrier layer 125 of the package assembly 100, except the barrier layer 225 of the package assembly 200 may have a thickness or z-height of approximately 50 nm.

In the embodiment of FIGS. 2-A through 2-C, the etching process described above with respect to FIG. 1-D may not be applied to the package assembly 200. Instead, a flatbond process may be applied to the package assembly 200 as shown in FIG. 2-B. Specifically, the flatbond process may include applying one or more chemical process, either sequentially or simultaneously, including immersion tin, nitric acid, and silane to chemically treat the pads 235a and 235b and/or traces 220. As shown in FIG. 2-B, the flatbond process may result in an outer layer 240 of tin or some other suitable material forming on the pads 235a and 235b and/or traces 220.

FIG. 2-C depicts the package assembly 200 after the application of the flatbond process. In embodiments, the flatbond process may have the result of chemically softening or otherwise roughening the surface of the pads 235a and 235b, which may be relatively smooth when the pads 235a and 235b are initially formed as described above with respect to pads 135a and 135b. For example, the pads 235a and 235b may form an outer layer 240 as described above. A solder resist layer 250 may then be applied to the package assembly 200. Due to the softening/roughening of the flatbond process, and the formation of the outer layer 240, the solder resist layer 250 may more securely couple with the package assembly 200. For example, the solder resist layer 250 may more securely couple with the pads 235 and/or the traces 220.

The package assembly 200 may include one or more openings 260a and 260b in the solder resist layer 250, as shown in FIG. 2-C. In some embodiments, an opening such as opening 260b may expose the outer layer 240 of a pad such as pad 235b. As discussed above with respect to openings 160a and 160b, the openings 260a and 260b may be formed via a chemical, mechanical, or optical removal, masking, or stripping process, or some other appropriate process.

In some embodiments, after the formation of an opening such as opening 260a, the outer layer 240 may be stripped to expose the metal of the pad 235a, as shown in opening 260a where at least a portion of the outer layer 240 is generally removed from the opening 260a. As shown in FIG. 2-C, portions of the outer layer 240 may still be coupled with the pad 235a and the solder resist layer 250 on the periphery of the opening 260a. That is, the entire outer layer 240 may not be removed. In embodiments, the outer layer 240 may be removed or stripped via one or more of a chemical, mechanical, or optical removal or stripping process, or some other appropriate process. In some embodiments, after the outer layer 240 is removed or stripped, an interconnect 255, which may be similar to interconnects 155 discussed above, may be disposed within the opening 260a and coupled with pad 235a.

Figure 3:
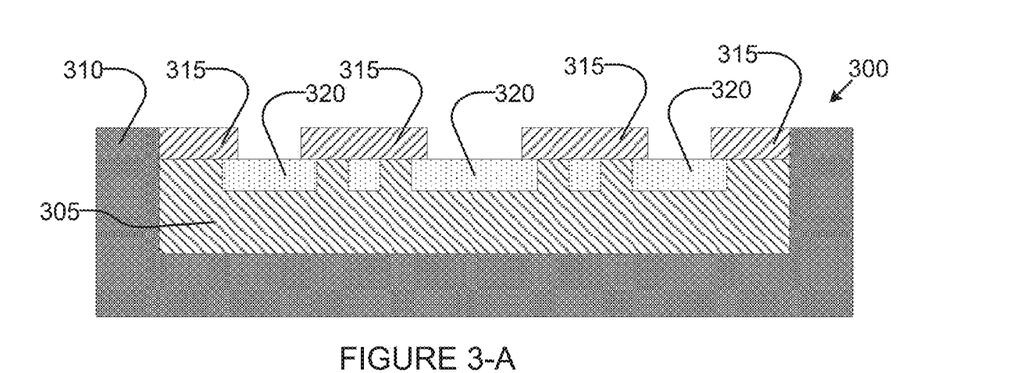

FIGS. 3-A through 3-F depict an alternative example of a package assembly 300 that may have a reduced layer count and or a reduced z-height. In embodiments, elements of FIG. 3-A may be similar to similarly numbered elements of the package assembly 100 of FIG. 1-A. For example, the package assembly 300 may include a die 305, mold compound 310, surface coat 315, and traces 320, which may be respectively similar to the die 105, mold compound 110, surface coat 115, and traces 120 of the package assembly 100 of FIG. 1-A.

In embodiments, a seed layer 330 may then be applied to the package assembly 300. Specifically, the seed layer 330 may be electroless (e-less) copper material after a desmear process. In other words, a desmear process may be a chemical process that may roughen the surface of a dielectric material such as die 305. The roughening may assist with adhesion of a subsequent electroless copper process, which may involve depositing a thin copper layer, possibly on the scale of one micron thick in the z-direction, through a chemical reaction. In embodiments, the seed layer 330 may be plated onto the package assembly 300, though in other embodiments the seed layer 330 may be deposited or formed on the package assembly 300 through one or more other suitable processes. In embodiments, the seed layer 330 may be subjected to a chemical adhesion promotion process to roughen some or all of the seed layer 330. The chemical adhesion promotion process may involve, for example, a Covabond® process as developed by Atotech Deutschland GmbH. The Covabond® process may involve a series of chemical processes including Covabond® spraying, baking, permanganate, and application of a reducer to treat the surface of dielectric materials such as die 305 to promote adhesion of the subsequent electroless seed layer 330. By roughening the portions of the seed layer 330, the amount of etching or roughening of one or more pads of the package assembly 300 may be reduced or minimized so that the traces 320, die 305, and/or surface coat 315 may not be negatively impacted by a later roughening or etching process.

After the deposition of the seed layer 330 and the subsequent covabonding process, one or more pads 335a and 335b may be deposited on the seed layer 330 as described above with respect to seed layer 130 and pads 135a and 135b and as shown in FIG. 3-C. The pads 335a and 335b may be respectively similar to the pads 135a and 135b described above, and deposited onto the package assembly 300 in a similar manner. Specifically, as discussed above a DFR may be applied to the package assembly 300 to define one or more patterns for the pads 335a and 335b. The pads 335a and 335b may then be deposited on the package assembly 300 through a process such as plating or some other deposition process, and then the DFR may be removed. Other processes for forming the one or more pads 335a and 335b may additionally or alternatively be used. As shown in FIG. 3-C, the pads 335a and 335b may be part of the seed layer 330. In other embodiments, the pads 335a and 335b may be formed of one or more materials that are different than the material of the seed layer 330.

As shown in FIG. 3-D, portions of the seed layer 330 of FIG. 3-C may then be removed from the package assembly 300. Specifically, the portions of the seed layer 330 that are not directly part of the pads 335a and 335b may be removed from the surface coat 315, mold compound 310, traces 320, and/or die 305. This removal of the portions of the seed layer 330 may be done through one or more processes such as chemical, mechanical, optical, masking, or other known processes for removing one or more substances from a package assembly 300.

As shown in FIG. 3-E, a flatbond process may be applied to or performed on the package assembly 300, which may be similar to the flatbond process described above with respect to the package assembly 200. As a result, one or more outer layer 340 may form on one or more of the pads 335a and 335b and/or traces 320, which may be similar to the outer layers 240 discussed above with respect to package assembly 200.

Finally, as shown in FIG. 3-F, a solder resist layer 350, which may be similar to the solder resist layer 250 of package assembly 200, may be applied to package assembly 300. One or more openings 360a and 360b may be formed in the solder resist layer 350. As discussed above, in some embodiments an opening such as opening 360b may be formed in the solder resist layer to expose the outer layer 340 of a pad 335b, as discussed above with respect to opening 260b, outer layer 240, and pad 235b of package assembly 200. In some embodiments, all or part of the outer layer 340 may be removed or otherwise stripped to expose the metallic pad 335a, as shown in opening 360a and as discussed with respect to opening 260a, outer layer 240, and pad 235a of package assembly 200. As discussed above, in some embodiments at least part of the outer layer 340 may remain subsequent to the stripping or removal process, for example the portion of the outer layer 340 that is not exposed by the opening 360a and is coupled with the solder resist layer 350 as shown in FIG. 3-F. Finally, an interconnect 355, which may be similar to interconnects 155 or 255, may be coupled with the pad 335a in the opening 360c. Similarly to package assemblies 100 and 200, and interconnects 155 and 255 as discussed above, in some embodiments the package assembly 300 may include a plurality of interconnects 355 coupled with a plurality of pads of the package assembly 300.

Figure 4:
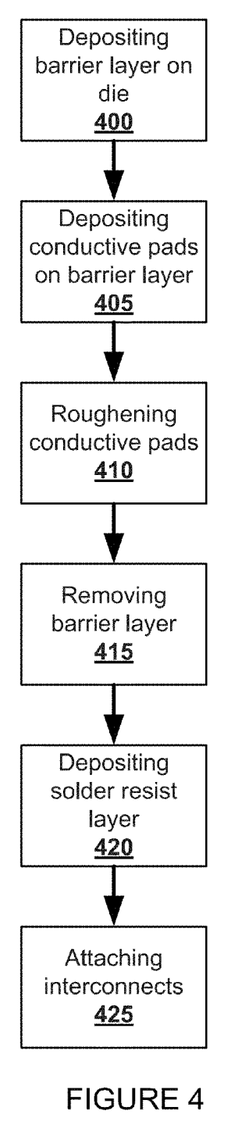
FIG. 4 illustrates an example of a process for manufacturing a package assembly, in accordance with embodiments.

FIG. 4 depicts an example process for manufacturing a package assembly such as package assembly 100. In embodiments, a barrier layer such as barrier layer 125 may be deposited on a die 105 at 400. The die 105 may include or otherwise be coupled with one or more of traces 120, mold compound 110, and/or surface coat 115.

Next, one or more conductive pads such as pads 135a and 135b may be deposited on the barrier layer 125 at 405. In some embodiments, the pads 135a and 135b may be deposited on top of a seed layer such as seed layer 130. In some embodiments the pads 135a and 135b may be deposited using a DFR or masking process, though in other embodiments the pads 135a and 135b may be deposited using one or more other techniques or processes.

Next, the pads 135 may be roughened at 410. In embodiments, the pads 135a and 135b may be roughened by chemical etching using a peroxide based spray, though in other embodiments the pads 135a and 135b may be roughened using one or more other processes or techniques. As discussed above, the barrier layer 125 may protect one or more elements of the die 105 such as the die 105 itself, traces 120, and/or surface coat 115 during the roughening process. Therefore, after the roughening is complete, the barrier layer 125 may be removed at 415. As described above, the barrier layer 125 may be removed through one or more processes or techniques such as optical, chemical, or mechanical etching, drilling, masking, or some other removal technique.

A solder resist layer such as solder resist layer 150 may then be deposited on the package assembly 100 at 420. As described above, the solder resist layer 150 may be deposited on the package assembly 100 through one or more techniques such as film lamination, liquid coating, etc. Finally, one or more interconnects such as interconnects 155 may be attached at 425 to the package assembly 100 as discussed above with respect to FIG. 1-F. For example, one or more openings 160a or 160b may be formed in the solder resist layer 150, and the one or more interconnects 155 may be deposited within the openings 160a or 160b and coupled with one or more of the pads 135a and 135b.

Figure 5:
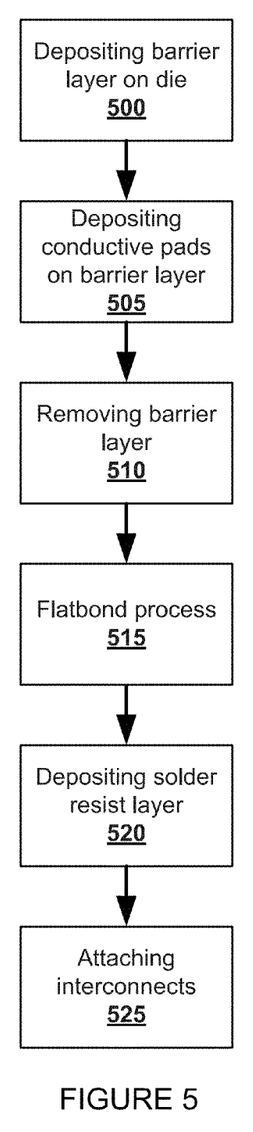
FIG. 5 illustrates another example of a process for manufacturing a package assembly, in accordance with embodiments.

FIG. 5 depicts an alternative example process for manufacturing a package assembly such as package assembly 200. In embodiments, a barrier layer such as barrier layer 225 may be deposited on a die 205 at 500. The die 205 may include or otherwise be coupled with one or more of traces 220, mold compound 210, and/or surface coat 215.

Next, one or more conductive pads such as pads 235a and 235b may be deposited on the barrier layer 225 at 505. In some embodiments, the pads 235a and 235b may be deposited on top of a seed layer. In some embodiments, the pads 235a and 235b may be deposited using a DFR layer or masking process, though in other embodiments the pads 235a and 235b may be deposited using one or more other techniques or processes.

Next, the barrier layer may be removed at 510. As described above, the barrier layer 225 may be removed through one or more processes or techniques such as optical, chemical, or mechanical etching, drilling, masking, or some other removal technique. After the barrier layer 225 is removed at 510, a flatbond process may be applied to the package assembly 200 at 515. The flatbond process may be similar to the flatbond process described above with respect to FIG. 2-A. For example, the flatbond process may include chemically roughening or softening one or more pads 235a and 235b of the package assembly 200, as described above.

After the flatbond process is applied at 515, a solder resist layer 250 may then be deposited on the package assembly 200 at 520. As described above, the solder resist layer 250 may be deposited on the package assembly 200 through one or more techniques such as the techniques described above with respect to process element 420 of FIG. 4. Finally, one or more interconnects such as interconnect 255 may be attached to the package assembly 200 at 525 as discussed above with respect to FIG. 2-C. For example, one or more openings 260a, 260b, or 260c may be formed in the solder resist layer 250. In some embodiments, at least a portion of an outer layer such as outer layer 240 of the pads 235a, which may be an undesirable side effect of the flatbond process at 515, may be removed from at least a portion of an opening such as opening 260a to expose a pad 235a in the openings 260a. Finally, an interconnect such as interconnect 255 may be coupled with a pad such as the interconnect 255 in opening 260a of FIG. 2-C.

Figure 6:
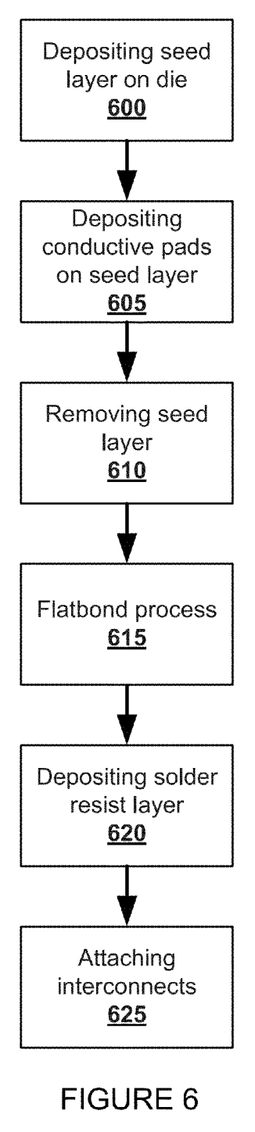
FIG. 6 illustrates another example of a process for manufacturing a package assembly, in accordance with embodiments.

FIG. 6 depicts an alternative example process for manufacturing a package assembly such as package assembly 300. In embodiments, an electroless seed layer such as seed layer 330 may be deposited on a die 305 at 600. The die 305 may include or otherwise be coupled with one or more traces 320, mold compound 310, and/or surface coat 315. As described above, the seed layer 330 may be plated on one or more portions of the die 305, however in other embodiments the seed layer 330 may be deposited on the die 305 or package assembly 300 using one or more additional or alternative techniques or processes.

Next, one or more conductive pads such as pads 335a and 335b may be deposited on the seed layer 330 at 605. In some embodiments, the pads 335a and 335b may be deposited using a DFR layer or masking process, though in other embodiments the pads 335a and 335b may be deposited using one or more other techniques or processes.

Next, at least portions of the seed layer 330 may be removed at 610. As described above, the seed layer 330 may be removed through one or more processes or techniques such as optical, chemical, or mechanical etching, drilling, masking, or some other removal technique. After the seed layer 330 is removed at 610, a flatbond process may be applied to the package assembly 300 at 615. The flatbond process may be similar to the flatbond process described above with respect to FIG. 3-E. For example, the flatbond process may include chemically roughening or softening one or more pads 335a and 335b of the package assembly 300, as described above.

After the flatbond process is applied at 615, a solder resist layer 350 may then be deposited on the package assembly 300 at 620. As described above, the solder resist layer 350 may be deposited on the package assembly 300 through one or more techniques such as the techniques described above with respect to process elements 420 or 520 of FIG. 4 or 5, respectively. Finally, one or more interconnects such as interconnect 355 may be attached to the package assembly 300 at 625 as discussed above with respect to FIG. 3-E. For example, one or more openings 360a or 360b may be formed in the solder resist layer 350. In some embodiments, at least a portion of an outer layer such as outer layer 340 of the pads 335, which may be an undesirable side effect of the flatbond process at 615, may be removed from at least a portion of an opening such as openings 360b or 360c to expose a pad 335 in the openings 360b or 360c. Finally, an interconnect such as interconnect 355 may be coupled with a pad such as the interconnect 355 in opening 360a of FIG. 3-F.

Figure 7:
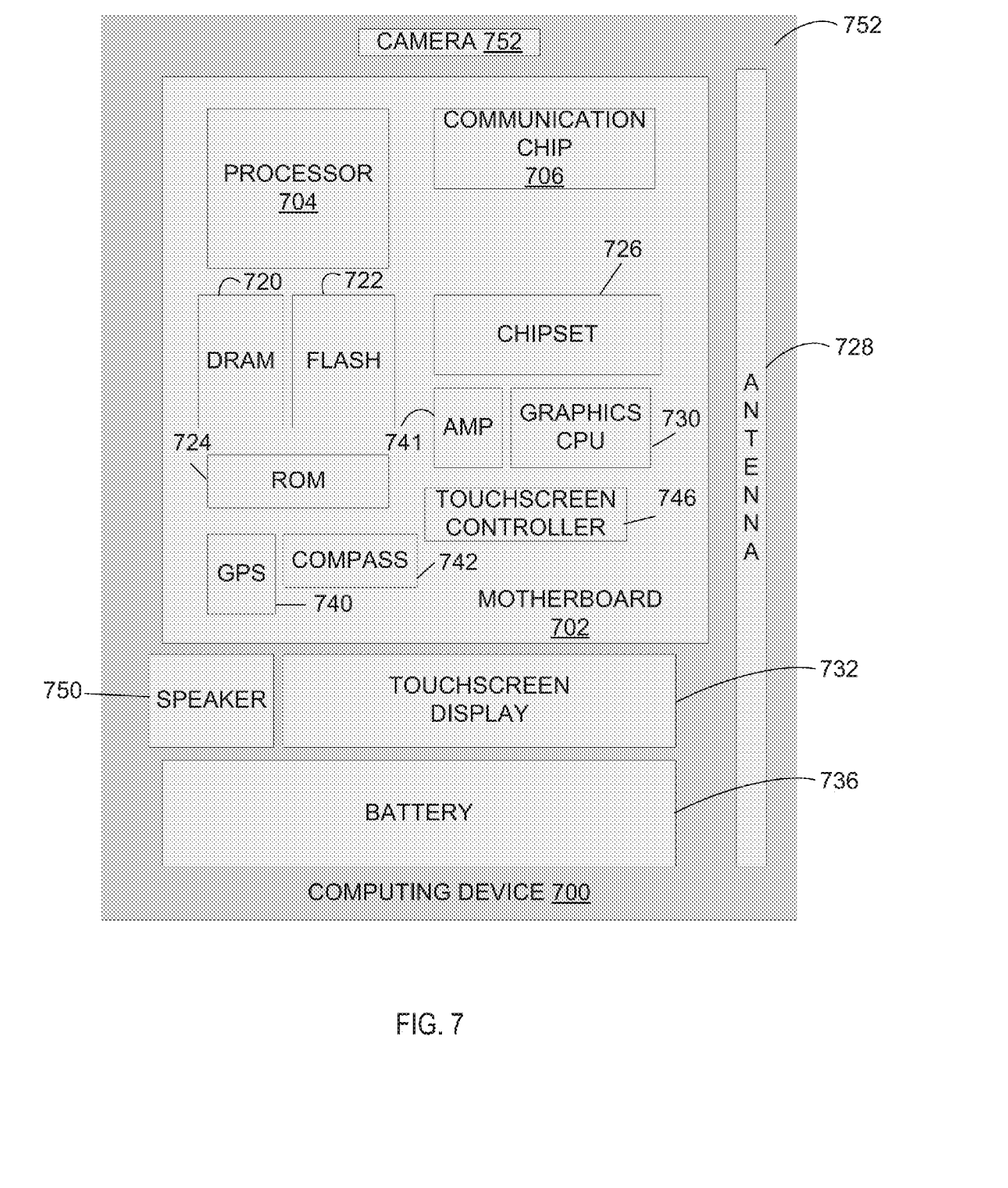
FIG. 7 schematically illustrates a computing device, in accordance with embodiments

Embodiments of the present disclosure may be implemented into a system using any suitable hardware and/or software to configure as desired. FIG. 7 schematically illustrates a computing device 700 in accordance with one implementation of the invention. The computing device 700 may house a board such as motherboard 702 (e.g., housing 752). The motherboard 702 may include a number of components, including but not limited to a processor 704 and at least one communication chip 706. The processor 704 may be physically and electrically coupled to the motherboard 702. In some implementations, the at least one communication chip 706 may also be physically and electrically coupled to the motherboard 702. In further implementations, the communication chip 706 may be part of the processor 704.

Depending on its applications, computing device 700 may include other components that may or may not be physically and electrically coupled to the motherboard 702. These other components may include, but are not limited to, volatile memory (e.g., DRAM) 720, non-volatile memory (e.g., ROM) 724, flash memory 722, a graphics processor 730, a digital signal processor (not shown), a crypto processor (not shown), a chipset 726, an antenna 728, a display (not shown), a touchscreen display 732, a touchscreen controller 746, a battery 736, an audio codec (not shown), a video codec (not shown), a power amplifier 741, a global positioning system (GPS) device 740, a compass 742, an accelerometer (not shown), a gyroscope (not shown), a speaker 750, a camera 754, and a mass storage device (such as hard disk drive, compact disk (CD), digital versatile disk (DVD), and so forth) (not shown). Further components, not shown in FIG. 7, may include a microphone, a filter, an oscillator, a pressure sensor, or an RFID chip. In embodiments, one or more of the components may be a package assembly such as package assemblies 100, 200, or 300.

The communication chip 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 706 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 706 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 706 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 706 may operate in accordance with other wireless protocols in other embodiments.

The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others. In some embodiments, one or more of the communication chips may include a die in a package assembly such as, for example, one of package assemblies 100, 200, 300 described herein.

The processor 704 of the computing device 700 may include a die in a package assembly such as, for example, one of package assemblies 100, 200, 300 described herein. The term "processor" may refer to any device or portion of a device that processes electronic data from registers and/or memory to transform that electronic data into other electronic data that may be stored in registers and/or memory.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data, for example an all-in-one device such as an all-in-one fax or printing device.

EXAMPLES

Example 1 may include a package assembly comprising: a die having a first side and a second side opposite the first side, wherein the die includes one or more traces on the first side; one or more pads, wherein individual pads of the one or more pads have a first side and a second side opposite the first side, and wherein the first side of the individual pads is coupled with the first side of the die; and a barrier layer directly coupled with the first side of the individual pads and disposed between the first side of the individual pads and the first side of the die.

Example 2 may include the package assembly of example 1, wherein the barrier layer includes a first side and a second side, and wherein the first side of the barrier layer is directly coupled with the first side of the individual pads, and wherein the second side of the barrier layer is directly coupled with the first side of the die.

Example 3 may include the package assembly of example 1, wherein the barrier layer comprises titanium, titanium nitride, tantalum, tantalum nitride, or titanium tungstate.

Example 4 may include the package assembly of any of examples 1-3, wherein a first pad and a second pad of the individual pads define a cavity between the first pad and the second pad, the cavity being disposed directly adjacent to the first side of the die.

Example 5 may include the package assembly of example 4, wherein the second side of the first pad has a chemically roughened surface and the first side of the die in the cavity has a surface that is not chemically roughened.

Example 6 may include the package assembly of example 5, further comprising a solder ball directly coupled with the second side of the first pad.

Example 7 may include the package assembly of example 5, further comprising a solder resist layer directly coupled to the first side of the die in the cavity and at least part of the second side of the first pad.

Example 8 may include the package assembly of example 7, further comprising a flatbond layer directly coupled to, and positioned between, the solder resist layer and the at least part of the second side of the first pad.

Example 9 may include the package assembly of any of examples 1-3, wherein the one or more pads include copper.

Example 10 may include the package assembly of any of examples 1-3, further comprising a dielectric layer coupled with at least the second side of the die, and surrounding the die such that the dielectric layer is level with the first side of the die, and wherein the barrier layer is directly coupled with the dielectric layer.

Example 11 may include a method comprising: depositing a barrier layer directly on a first side of a die; forming a first pad and a second pad directly on the barrier layer; chemically roughening the first pad and the second pad; and removing a portion of the barrier layer such that a portion of the barrier layer remains disposed between the first pad and the first side of the die and between the second pad and the first side of the die.

Example 12 may include the method of example 11, wherein the barrier layer is sputter deposited.

Example 13 may include the method of example 11, wherein the barrier layer includes titanium.

Example 14 may include the method of example 11, wherein the first pad includes copper.

Example 15 the method of any of examples 11-14, wherein the chemically roughening includes chemically etching the first pad and the second pad with a peroxide based solution.

Example 16 the method of any of examples 11-14, further comprising depositing, after the depositing the barrier layer, a seed material on the barrier layer prior to depositing the first pad and the second pad.

Example 17 may include the method of any of examples 11-14, further comprising: depositing a solder resist layer directly on the first side of the die and the chemically roughened first pad and second pad; forming an cavity in the solder resist layer such that the chemically roughened first pad is exposed; and attaching a conductive element directly to the chemically roughened first pad in the cavity.

Example 18 may include a system with a package assembly, the system comprising: a circuit board; and a package assembly coupled with the circuit board, the package assembly comprising: a die having a first side and a second side opposite the first side, wherein the die includes one or more traces on the first side; one or more pads, wherein individual pads of the one or more pads have a first side and a second side opposite the first side, and wherein the first side of the individual pads is coupled with the first side of the die; and a barrier layer directly coupled with the first side of the individual pads and disposed between the first side of the individual pads and the first side of the die.

Example 19 may include the system of example 18, wherein a first pad and a second pad of the individual pads define a cavity between the first pad and the second pad, the cavity being disposed directly over the first side of the die.

Example 20 may include the system of example 19, wherein the second side of the first pad has a chemically roughened surface and the first side of the die in the opening has a surface that is not chemically roughened.

Example 21 may include the system of example 20, further comprising a solder ball directly coupled with the second side of the first pad.

Example 22 may include the system of example 20, further comprising a solder resist layer directly coupled to the first side of the die in the cavity and at least part of the second side of the first pad.

Example 23 may include the system of example 22, further comprising a flatbond layer directly coupled to, and positioned between, the solder resist layer and the at least part of the second side of the first pad.

Example 24 may include the system of any of examples 18-23, wherein the barrier layer includes a first side and a second side, and wherein the first side of the barrier layer is directly coupled with the first side of the individual pads, and wherein the second side of the barrier layer is directly coupled with the first side of the die.

Example 25 may include the system of any of examples 18-23, wherein the barrier layer comprises titanium, titanium nitride, tantalum, tantalum nitride, or titanium tungstate.

Example 26 may include the system of any of examples 18-23, wherein the one or more pads include copper.

Example 27 may include the system of any of examples 18-23, further comprising a dielectric layer coupled with at least the second side of the die, and surrounding the die such that the dielectric layer is level with the first side of the die, and wherein the barrier layer is directly coupled with the dielectric layer.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:
1. A package assembly comprising:
a die having a first side and a second side opposite the first side, wherein the die includes one or more traces on the first side;
one or more pads, wherein a first pad of the one or more pads has a first side and a second side opposite the first side, the first side of the first pad is coupled with the first side of the die and one of the one or more traces;
a metal outer layer directly coupled to, and positioned over, the second side of the first pad, wherein the outer layer partially covers an edge part of the second side of the first pad, and a middle part of the second side of the first pad is not covered by the outer layer;
a solder ball directly coupled with the second side of the first pad; and a barrier layer directly coupled with the first side of the first pad and disposed between the first side of the first pad and the first side of the die.

2. The package assembly of claim 1, wherein the barrier layer includes a first side and a second side, and wherein the first side of the barrier layer is directly coupled with the first side of the first pad, and wherein the second side of the barrier layer is directly coupled with the first side of the die.

3. The package assembly of claim 1, wherein the barrier layer comprises titanium, titanium nitride, tantalum, tantalum nitride, or titanium tungstate.

4. The package assembly of claim 1, wherein the first pad and a second pad of the one or more pads define a cavity between the first pad and the second pad, the cavity being disposed directly adjacent to the first side of the die.

5. The package assembly of claim 1, wherein the first side of the first pad has a surface that is not chemically roughened.

6. The package assembly of claim 4, further comprising a solder resist layer directly coupled to the first side of the die in the cavity and at least part of the second side of the first pad.

7. The package assembly of claim 1, wherein the second side of the first pad has a roughened surface completely covering the second side of the first pad.

8. The package assembly of claim 1, wherein the one or more pads include copper.

9. The package assembly of claim 1, further comprising a dielectric layer coupled with at least the second side of the die, and surrounding the die such that the dielectric layer is level with the first side of the die, and wherein the barrier layer is directly coupled with the dielectric layer.

10. A method comprising:
depositing a barrier layer directly on a first side of a die;
forming a first pad and a second pad directly on the barrier layer;
chemically roughening the first pad and the second pad; and
removing a portion of the barrier layer such that a portion of the barrier layer remains disposed between the first pad and the first side of the die and between the second pad and the first side of the die; and
forming a metal outer layer directly coupled to, and positioned over, the first pad on a side of the first pad opposite the barrier layer, wherein the outer layer partially covers an edge part of the side of the first pad, and a middle part of the side of the first pad is not covered by the outer layer; and
directly coupling a solder ball with the side of the first pad.

11. The method of claim 10, wherein the barrier layer is sputter deposited.

12. The method of claim 10, wherein the barrier layer includes titanium.

13. The method of claim 10, wherein the first pad includes copper.

14. The method of claim 10, wherein the chemically roughening includes chemically etching the first pad and the second pad with a peroxide based solution.

15. The method of claim 10, further comprising depositing, after the depositing the barrier layer, a seed material on the barrier layer prior to depositing the first pad and the second pad.

16. The method of claim 10, further comprising:
depositing a solder resist layer directly on the first side of the die and the chemically roughened first pad and second pad;
forming a cavity in the solder resist layer such that the chemically roughened first pad is exposed; and
attaching a conductive element directly to the chemically roughened first pad in the cavity.

17. A system with a package assembly, the system comprising:
a circuit board; and
a package assembly coupled with the circuit board, the package assembly comprising:
a die having a first side and a second side opposite the first side, wherein the die includes one or more traces on the first side;
one or more pads, wherein a first pad of the one or more pads has a first side and a second side opposite the first side, and wherein the first side of the first pad is coupled with the first side of the die;
a metal outer layer directly coupled to, and positioned over the second side of the first pad, wherein the outer layer partially covers an edge part of the second side of the first pad, and a middle part of the second side of the first pad is not covered by the outer layer;
a solder ball directly coupled with the second side of the first pad; and
a barrier layer directly coupled with the first side of the first pad and disposed between the first side of the first pad and the first side of the die.

18. The system of claim 17, wherein the first pad and a second pad of the one or more pads define a cavity between the first pad and the second pad, the cavity being disposed directly over the first side of the die.

19. The system of claim 18, wherein the second side of the first pad has a roughened surface and the first side of the first pad has a surface that is not roughened.

* * * * *